United States Patent [19]

Tasaka

[11] Patent Number: 5,242,850
[45] Date of Patent: Sep. 7, 1993

[54] METHOD OF MANUFACTURING A SEMICONDUCTOR MEMORY DEVICE HAVING REDUCED PARASITICALLY DOPED LAYERS

[75] Inventor: Kazuhiro Tasaka, Tokyo, Japan

[73] Assignee: NEC Corporation, Tokyo, Japan

[21] Appl. No.: 784,990

[22] Filed: Oct. 30, 1991

[30] Foreign Application Priority Data

Oct. 30, 1990 [JP] Japan .................................. 2-292884

[51] Int. Cl.$^5$ .......................................... H01L 21/266
[52] U.S. Cl. ...................................... 437/48; 437/30; 437/44; 437/45
[58] Field of Search ........................ 437/27, 28, 29, 30, 437/41, 44, 45, 46, 48, 52, 56, 58, 148, 153, 154

[56] References Cited

U.S. PATENT DOCUMENTS

| | | | |
|---|---|---|---|
| 4,011,653 | 3/1977 | Kato et al. | 437/45 |
| 4,145,701 | 3/1979 | Kawagoe | 357/45 |
| 4,402,761 | 9/1983 | Feist | 437/45 |
| 4,908,327 | 3/1990 | Chapman | 437/44 |
| 4,927,777 | 5/1990 | Hsu et al. | 437/28 |
| 4,951,100 | 8/1990 | Parrillo | 437/44 |

FOREIGN PATENT DOCUMENTS 0241259 11/1985 Japan .
60-241259 11/1985 Japan .
61-218165 9/1986 Japan .

Primary Examiner—Brian E. Hearn
Assistant Examiner—C. Chaudhari
Attorney, Agent, or Firm—Sughrue, Mion, Zinn, Macpeak & Seas

[57] ABSTRACT

A method of producing a highly reliable mask ROM and the product produced by the method are disclosed. The method is characterized by comprising the steps of forming low doped source-drains to relax the electric field between the gate electrode and drain, thereby suppressing the creation of hot carriers, and of depositing dielectrics of a predetermined thickness between neighboring gates to control the projection range of impurities implanted into the source-drain region of the bit into which data is to be written, the thickness of the dielectrics being determined such that the projection range does not exceed the junction depth of the source-drain in order to preclude the formation of parasitically doped layers which cause punch-through across an unwritten transistor.

10 Claims, 2 Drawing Sheets

PRIOR ART

METHOD OF MANUFACTURING A SEMICONDUCTOR MEMORY DEVICE HAVING REDUCED PARASITICALLY DOPED LAYERS

BACKGROUND OF THE INVENTION

1. Field of the Invention

The present invention relates in general to a method of manufacturing a semiconductor memory and in particular to a method of manufacturing a large-capacity NAND-type mask ROM with submicrometer gates.

2. Description of the Related Art

A method of producing a NAND-type mask ROM is presented in Japanese Patent Laid-open No. 62-92362, in which data programming is performed through ion implantation. The method as a representative case of the prior art will be explained with reference to FIGS. 1 through 3 of the accompanying drawings.

As shown in FIG. 1, a field oxide 2 is first formed on a P-type silicon substrate 1 by the LOCOS method, and then a gate oxide 3 is formed on the substrate. Next, a polysilicon is deposited over the entire surface of the layers formed by the preceding steps and selectively etched to form polysilicon gate electrodes 4a through 4e, using a photoresist as a mask.

N+-type diffusion layers 9a through 9g are then formed in the P-type silicon substrate 1 by ion implantation using gate electrodes 4a through 4e as masks.

Next, photoresist 10 is formed in the manner shown in FIG. 2, in which openings 11 are provided above only each transistor or bit to which the data "ON" is to be written. These bits are hereafter referred to as data bits. Using photoresist 10 as a mask, phosphorus ions with an incident energy high enough to penetrate gate electrodes 4b and 4d are implanted into the silicon substrate, thereby forming N− doped channel layers 12b and 12e under the gate electrodes 4b and 4d, respectively. In this way, depletion-type MOSFETs are formed in the data bits which correspond to data-storing bits.

Next, as illustrated in FIG. 3, an interlayer dielectric 13 of PSG (Phospho-Silicate Glass) is formed over the existing surface, and a digit line contact 14 is opened above the N+-type diffusion layer 9a through interlayer dielectric 13. Finally, a digit line 15 of aluminum is deposited both on the interlayer dielectric 13 and in the digit line contact 14, and a NAND-type mask ROM device provided with N+-type single-drain MOSFETs in its memory cells and its peripheral circuits is obtained.

In the prior art above, when "ON" data is written by implanting the phosphorus ions through the gate electrodes to form the N− doped channel layers 12b, 12e N− doped layers 12a, 12c, 12d and 12f are also formed parasitically in the silicon substrate 1 underneath the source-drain diffusion layers, as shown in FIG. 2. These parasitically doped layers (hereafter, referred to as parasitic layers) allow junction depth $X_j$ of the sources and drains to be larger. As is well-known in the art, a MOSFET normally operates in response to a gate voltage, provided that the channel length L is sufficiently longer than the sum of the widths of the depletion layers in the source and drain junctions. However, when the scale of the device is reduced to the order of submicrometers, making the channel length L a critical value $L_{min}$ or less, punch-through tends to take place. According to an empirical law in the field of semiconductor devices, the critical channel length $L_{min}$ increases in proportion to $(X_j)^{\frac{1}{3}}$. Accordingly, punch-through tends to occur as the junction depth $X_j$ increases, even if the actual channel length L remains unchanged. As a result, punch-through takes place between parasitic layers 12c and 12d, i.e. across the channel region of the unwritten bit or "OFF" bit (9c, 9d, 4c), thereby generating a current path irresponsive to a control signal applied to gate electrode 4c. This leads to the problem that "OFF" data in the unwritten bit (9c, 9d, 4c) cannot be read.

Another problem arises from the fact that the foregoing semiconductor memory consists of N+-type single drain transistors. As is well-known, when the channel length L is not sufficiently long in comparison with critical length $L_{min}$, as is the case in a so-called submicrometer-scale device, hot carriers caused by a strong electric field between the drain and gate tend to be created between the gate electrode and drain. This creation of hot carrier brings about detrimental unstable behavior of the transistor which results in unreliable performance of the semiconductor device. This is the case in the peripheral circuit composed of an N+-type single drain transistor (9f, 9g, 4e) shown in FIG. 3.

This tendency becomes more prominent, with higher doping levels in the N+ diffusion layers of the source and drain. Accordingly, when an N+-type single-drain MOSFET is employed, the reliability of the device is a problem unless the power supply voltage is lowered according to pattern scaling.

SUMMARY OF THE INVENTION

It is an object of the present invention to provide a method of manufacturing a semiconductor memory in which no parasitic doped layer is formed when data is written.

Another object of the present invention is to provide a method of manufacturing a semiconductor memory comprising a single-drain MOSFET with a submicrometer gate in which hot carriers are less likely to be created.

A further object of the present invention is to provide a method of manufacturing a semiconductor memory and a highly reliable peripheral circuit composed of submicrometer-gate MOSFETs through common steps in parallel.

A still further object of the present invention is to provide a highly reliable semiconductor memory composed of single drain MOSFETs with submicrometer gates, in which hot carrier will not be created and punch-through will not occur.

The first object of the present invention can be attained by the first method for manufacturing a semiconductor memory. The method comprises the steps of (a) forming a first dielectric as a gate dielectric on a major surface of a semiconductor substrate of a first conductivity type, (b) forming a plurality of gate electrodes on the first dielectric, (c) implanting impurity ions of a second conductivity type into the semiconductor substrate using the gate electrodes as masks to form source-drain diffusion layers, thereby forming bits of the semiconductor memory, (d) forming a second dielectric of a prescribed thickness on the first dielectric between said gate electrodes, (e) coating a photoresist over the existing surface, the photoresist having an opening above each bit into which data is to be written, and (f) implanting impurity ions of the second conductivity type into the semiconductor substrate using the photoresist as a mask to write data in the bit.

According to this method, the projection range of the impurity ions implanted into the source-drain region through the second dielectric in step (f) can be varied depending on the thickness of the second dielectric. Accordingly, it is preferable to design the thickness so that the projection range does not exceed the junction depth of the source-drain. Thus, formation of a parasitically doped layer can be precluded.

Preferably step (b) includes step of forming gate electrodes so that the ratio of height of the gate electrodes to the distance between neighbouring gate electrodes equals or exceeds 1, and step (d) includes a step of depositing the second dielectric whose thickness is ½ or more the distance between the neighbouring gate electrodes and also a step of etching back the second dielectric to leave the prescribed thickness of the second dielectric unetched on the first dielectric between the gate electrodes.

The reasons why the ratio of the height of the gate electrode to the distance between the neighbouring gate electrodes (Hereafter the ratio is referred to as an aspect ratio) is selected to be equal to or more than 1 and why the second dielectric is preferably deposited to a thickness ½ or more the distance between the two gate electrodes are as follows: As the dielectric is deposited, the thickness of the deposited dielectric on the confronting sides of neighbouring gate electrodes increases, reducing the distance between dielectrics on the gate electrodes. When the thickness of the deposited dielectric on the confronting sides of the neighbouring gate electrodes reaches ½ of the distance between the gate electrodes, the dielectrics come into contact with each other, thereby completely filling the gap between the two gate electrodes. Generally, if the aspect ratio is sufficiently larger than 1, then the top surface of the dielectric at the time when the gap is completely filled becomes substantially parallel to the surface of the semiconductor substrate. The surface of the dielectric subsequently advances in a direction normal to the surface of the semiconductor substrate, i.e., upwardly. When the dielectric is etched back after the preceding deposition step, its surface is uniformly etched back downwardly. As a result, a uniform thickness of the dielectric can be left on the gate dielectric. In contrast, as the aspect ratio decreases from 1, the top surface of the deposit of the dielectric in an intermediate region between the neighbouring gate electrodes tends to be lower than the top surface of the deposit of the dielectric on the gate electrodes when the gap between the gate electrodes is completely filled. If such an uneven surface of the dielectric is then uniformly etched back, the thicknesses of the dielectrics in the intermediate region between the gate electrodes and in the end region near the confronting sides of the gate electrodes will be different. Consequently, when an implanting ion beam bombards the semiconductor substrate through the dielectric to write data, the projection range in the source-drain region immediately beneath the intermediate region between the gate electrodes will differ from the projection range in the source-drain regions immediately beneath the end region. As a result, the doped layers in the source-drain regions will not be of uniform depth. To avoid this drawback, an aspect ratio of 1 or more is selected.

In order to attain the second object of the present object, it is preferable to perform ion implantation in step (c) so as to form $N^-$ type diffusion layers of source-drains. By such a low doped drain, the electric field between the gate and drain can be relaxed, and consequently, the creation of hot carriers will be suppressed and high reliability of the semiconductor memory can be attained even when the gate length of the memory is on the order of submicrometers.

In addition, it should be noted that an N-type transistor is preferable to a P-type transistor on account of its high-speed operation.

The third object of the present invention can be attained by the second method for manufacturing a semiconductor memory device. The method comprises the steps of (a) forming a field layer on a major surface of a semiconductor substrate of a first conductivity type, (b) forming a first dielectric as a gate dielectric, (c) forming gate electrodes on said first dielectric wherein a plurality of the gate electrodes are formed in the memory region and at least one gate electrode is formed in the peripheral circuit region, (d) implanting low-concentration impurity ions of a second conductivity type into the semiconductor substrate using the gate electrodes as masks to form lightly doped source-drain diffusion layers, thereby forming bits of the memory and lightly doped layers of a LDD transistor in the peripheral circuit region, (e) forming a second dielectric of a prescribed thickness on the first dielectric between the gate electrodes in the memory region, and at the same time forming the second dielectric on the sides of each gate electrode in the peripheral circuit region, (f) implanting high-concentration impurity ions of the second conductivity type into the semiconductor substrate using the gate electrodes and the second dielectrics as masks to form a highly doped source-drain of the second conductivity type of the LDD transistor in the peripheral circuit region, (g) coating a photoresist over the existing surface, this photoresist having an opening above each bit into which data is to be written, and (h) implanting impurity ions of the second conductivity type into the semiconductor substrate using the photoresist as a mask to write data in the bit.

The above steps allow the memory region and the peripheral circuit region to be fabricated during the same steps. The source-drains in the memory and the lightly doped layers for an LDD transistor for relaxing the strong electric field near the drain junction are formed in step (d) in parallel and the second dielectric for preventing formation of parasitically doped layers in the memory region, i.e. filling layers, and the second dielectrics for defining doping regions of the highly doped source-drains through self-alignment in the peripheral circuit region, i.e. side wall dielectrics are both formed in step (e). In this way an LDD transistor which is free from hot carrier creation even when the gate length is on the order of submicrometers can be produced together with the semiconductor memory.

According to the present invention, there is further provided a semiconductor memory comprising a first dielectric formed as a gate dielectric on a major surface of a semiconductor substrate of a first conductivity type: a plurality of gate electrodes formed on the first dielectric, these gate electrodes having a gate length of submicrometer size: low doped source-drains of a second conductivity type formed in positions self-aligned with the gate electrodes in the semiconductor substrate: and a second dielectric of a prescribed thickness formed on the first dielectric between the gate electrodes: wherein the channel region of the bit in which data has been written is a low doped layer of the second conductivity type, and the prescribed thickness of the second dielectric is determined so that the projection range of the implanting ion beam incident for writing data and scattered forward through the second dielectric into the source-drain region of a bit into which the data is written does not exceed the junction depth of the source-drain.

Since the semiconductor memory is composed of a low doped single-drain MOSFET, creation of hot carrier is precluded, and as a result, even if circuit components are reduced in size according to device scaling, it is not necessary to vary the power supply voltage for the semiconductor memory in relation to the scaling. The second dielectric is effective in preventing impurity ions from being implanted more deeply than the junction depth of the source-drain region when the data is written. Accordingly, the manufactured semiconductor memory is protected from the generation of parasitic doped layers.

The above and other objects, features, and advantages of the present invention will become apparent from the following description referring to the accompanying drawings which illustrate an example of a preferred embodiment of the present invention.

DETAILED DESCRIPTION OF THE PREFERRED EMBODIMENT

A method of manufacturing a semiconductor memory according to the present invention will be described below with reference to FIGS. 4 through 7.

Figure 1:
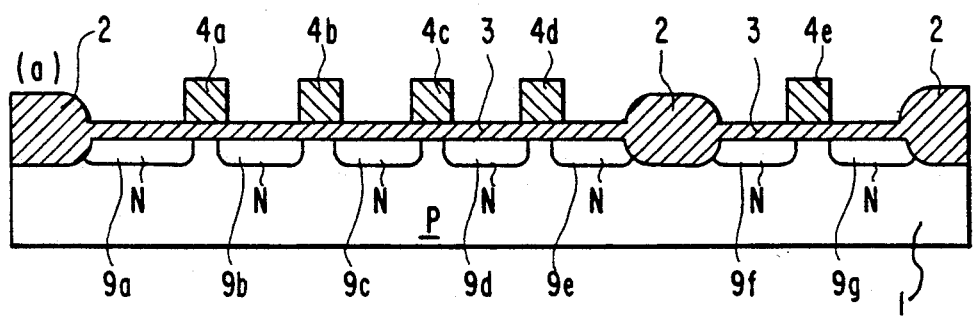
FIGS. 1 through 3 are cross-sectional views showing the conventional successive steps of manufacturing a semiconductor memory device.
Figure 2:
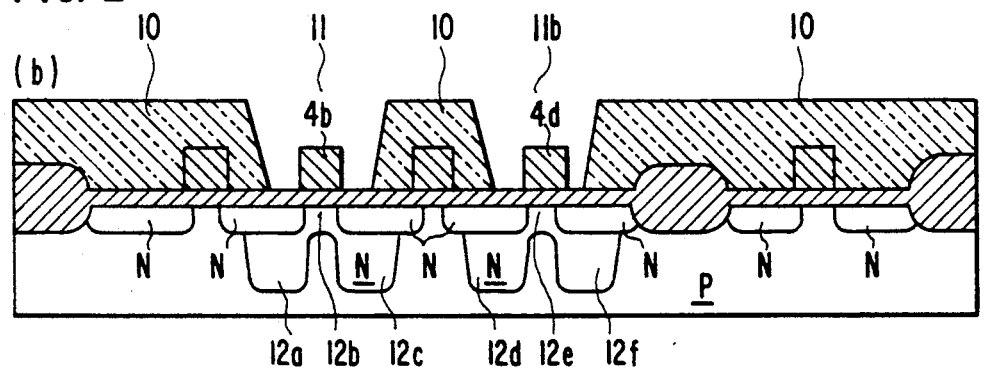
Figure 3:
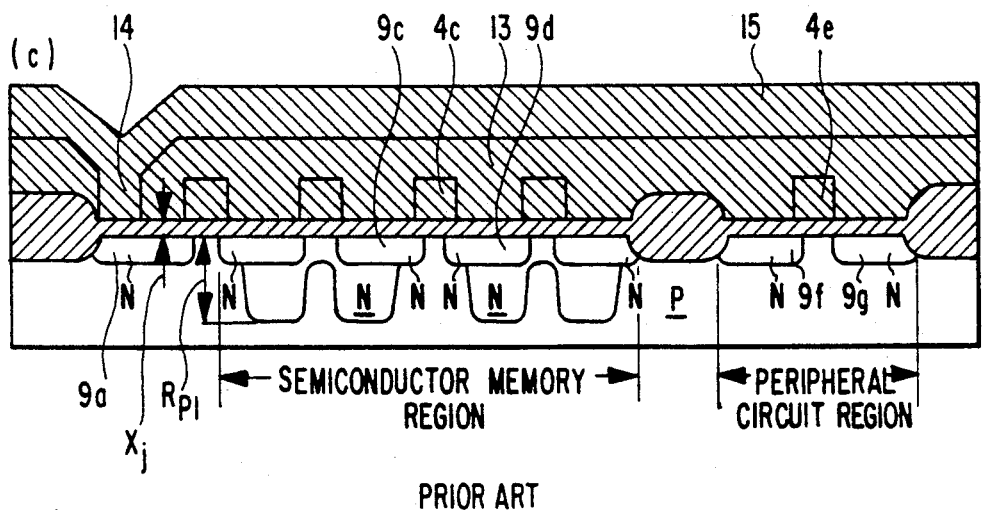
Figure 4:
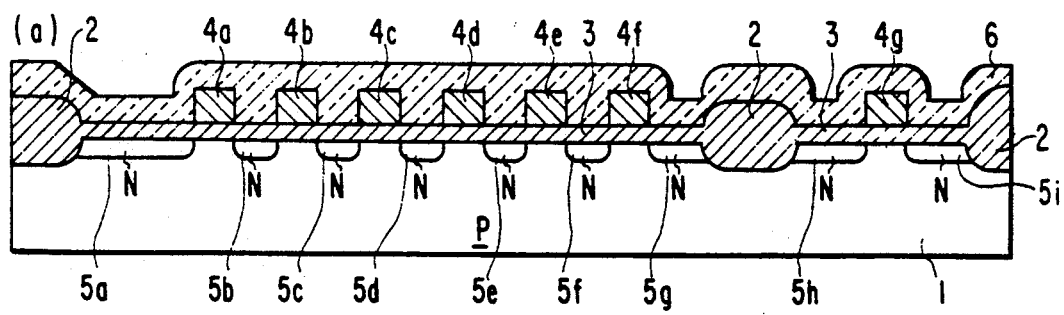
FIGS. 4 through 7 are cross-sectional views showing the successive steps of manufacturing a semiconductor memory device according to the present invention.

As shown in FIG. 4, a field oxide 2 having a thickness ranging from 600 to 800 nm is first formed on a P-type silicon substrate 1 by the LOCOS method and then a gate oxide 3 having a thickness ranging from 15 to 30 nm is formed thereon. Next, a polysilicon is deposited on the entire existing surface, and selectively etched to form gate electrodes 4a through 4g, using a photoresist as a mask.

In this step, the gate length i.e., the length of each gate electrode, is selected to be of submicrometer size in the range from 0.4 to 0.8 $\mu$m, and an aspect ratio, i.e., the ratio of the thickness of the polysilicon, or the height of the gate electrodes to the distance between neighbouring gate electrodes, is selected to be 1 or more for the reasons described above.

Using the gate electrodes 4a through 4g as masks, phosphorus ions are then implanted into the P-type silicon substrate 1 at a dose ranging from 1 to $3 \times 10^{13}$ cm$^{-2}$ at an acceleration voltage ranging from 30 to 50 KeV.

In this manner, N$^-$-type single-drain MOSFETs having N$^-$-type diffusion layers 5a through 5g are formed in the memory region, and N$^-$-type diffusion layers 5h, 5i for relaxing the electric field between the gate and drain are formed in the peripheral circuit.

Next, a dielectric 6 having a thickness ½ or more the distance between neighbouring gate electrodes is deposited on the existing surface, and heat-treated, thus filing the spaces between the gate electrodes in the memory region with the dielectric.

Figure 5:
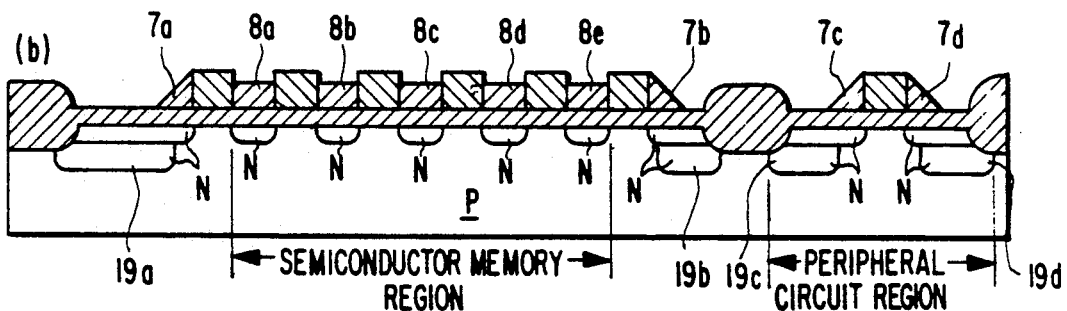

As shown in FIG. 5, the dielectric 6 is then etched back to leave filling layers 8a through 8e at a predetermined thickness along with side wall dielectrics 7a through 7d.

The thickness D$_0$ of the filling layers 8a through 8e is selected so that the projection range R$_{p1}$ of the implanting ion beam incident for writing data, as measured from the substrate surface, which is scattered forward through the filling layers 8a through 8d into the source-drain regions (the source-drain of the data bits) underneath the filling layers is equal to the source-drain junction depth X$_j$.

After the filling layers 8a through 8e and the side wall dielectrics 7a through 7d have been formed, arsenic ions are implanted into the silicon substrate using the gate electrode, the filling layers and the side wall dielectrics as masks, thereby forming N$^+$-type doped layers 19a through 19d which are self-aligned with the side wall dielectrics. In this way, an LDD transistor is formed in the peripheral circuit region.

Figure 6:
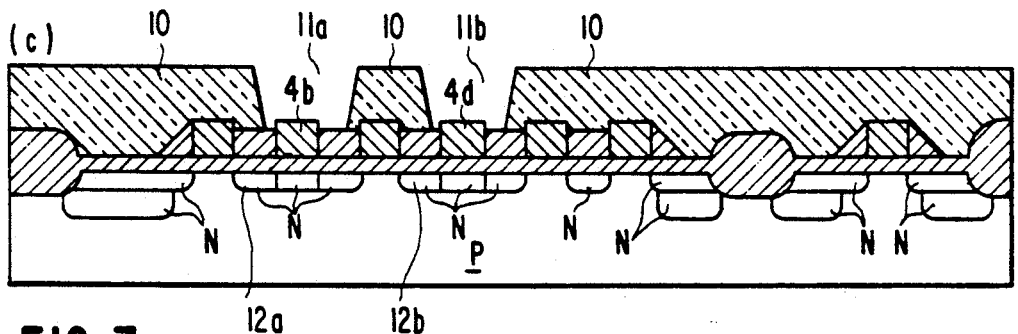

A photoresist 10 having openings 11a and 11b above only the transistors in which data "ON" are to be written is then formed, as shown in FIG. 6. Using the photoresist 10 as a mask, phosphorus ions are implanted into the silicon substrate 1 at an incident energy high enough to penetrate the gate electrodes 4b and 4d, thereby forming N$^-$ type channel doped layers 12a and 12b underneath the gate electrodes 4b and 4d, in which the data "ON" is written.

The incident energy of the phosphorus ion beam is determined so that projection range R$_{p2}$, the projection range of the phosphorus ion beam incident for writing data which is scattered forward through the gate electrodes into the channel region underneath the gate electrodes 4b and 4d, is also equal to the source-drain junction depth X$_j$. In this way, a channel doped layer and drain-source diffusion layers of the same profile are formed without forming any parasitic layer, thereby preventing the generation of punch-through across an "OFF" bit between the "ON" bits.

Figure 7:
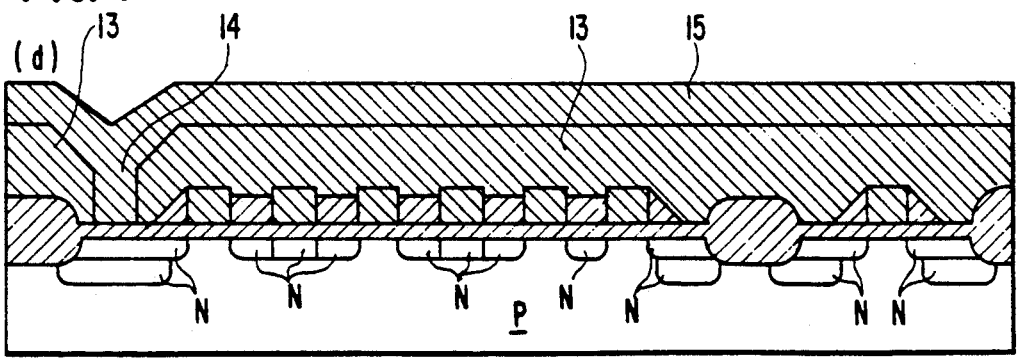

Next, as shown in FIG. 7, an interlayer dielectric 13 of PSG is formed and a digit line contact 14 is opened in the interlayer dielectric 13 on the N$^+$-type diffusion layer 9a or the N$^-$-type diffusion layer 5a. Subsequently, a digit line 15 of aluminum is deposited on the interlayer dielectric 13 and in the digit line contact 14. In this way, formation of the NAND-type mask ROM and the peripheral circuit of the LDD transition is achieved.

The above embodiment is a typical example of the method for producing a NAND-type mask ROM and the product provided by the method. However, the present invention is not limited to the illustrated embodiment and should be understood to have various modifications. For example, while the first and second conductivity types are P and N respectively in the above embodiment, they can also be N and P respectively, although high-speed operation cannot be expected in the latter option.

Further, in the embodiment above, the thickness D$_0$ of the filling layers 8a through 8e is so prescribed that the projection range R$_{p1}$ is equal to the source-drain junction depth X$_j$. However, since the requirement for the projection range R$_{p1}$ is that R$_{p1}$ should not exceed the junction depth X$_j$ in order to preclude the formation of parasitic layers, the thickness of the filling layers can also be larger than D$_0$.

Although the variations of the embodiment described above are possible, the scope of the present invention is defined in the appended claims.

What is claimed is:

1. A method of manufacturing a semiconductor memory, comprising the steps of:
   (a) forming a first dielectric as a gate dielectric on a major surface of a semiconductor substrate of a first conductivity type;
   (b) forming a plurality of gate electrodes on the first dielectric;
   (c) implanting impurity ions of a second conductivity type into the semiconductor substrate using the gate electrodes as masks to form source drain diffusion layers, thereby forming bits of the semiconductor memory;
   (d) forming a second dielectric of a prescribed thickness on the first dielectric between the gate electrodes;
   (e) coating a photoresist over the existing surface, the photoresist having an opening above each bit into which data is to be written;
   (f) implanting impurity ions of the second conductivity type into the semiconductor substrate using the photoresist as a mask to write data in the bit;
   wherein step (b) includes a step of forming the gate electrodes so that the ratio of the height of the gate electrodes to the distance between neighboring gate electrodes equals or exceeds 1, and step (d) includes a step of depositing the second dielectric to a thickness ½ or more the distance between the neighboring gate electrodes and a step of etching back the second dielectric to leave the prescribed thickness of the second dielectric unetched on the first dielectric between the gate electrodes.

2. The method according to claim 1, wherein the prescribed thickness of the second dielectric is determined so that the projection range of the implanting ion beam used in step (f) scattered forward through the second dielectric into the source-drain region does not exceed the junction depth of the source-drain.

3. The method according to claim 2, wherein the first and second conductivity types are P and N respectively, the length of each gate electrode is designed to be on the order of submicrometers and in step (c) ion implantation is performed to form $N^-$-type diffusion layers of the source-drains.

4. The method according to claim 1, wherein the prescribed thickness of the second dielectric is determined so that the projection range of the implanting ion beam used in step (f) scattered forward through the second dielectric into the source-drain region does not exceed the junction depth of the source-drain.

5. The method according to claim 3, wherein in step (f) a kind and concentration of impurity ions in the implanting ion beam are so selected as to form an $N^-$ type channel doped layer in the bit into which data is to be written.

6. A method of manufacturing a semiconductor memory device which includes a peripheral circuit region as well as a memory region, comprising the steps of:
   (a) forming a field layer on a major surface of a semiconductor substrate of a first conductivity type;
   (b) forming a first dielectric as a gate dielectric;
   (c) forming gate electrodes on the first dielectric wherein a plurality of the gate electrodes are formed in the memory region and at least one gate electrode is formed in the peripheral circuit region;
   (d) implanting low-concentration impurity ions of a second conductivity type into the semiconductor substrate using the gate electrodes as masks to form lightly doped source-drain diffusion layers, thereby forming bits of the memory and lightly doped layers of an LDD transistor in the peripheral circuity region;
   (e) forming a second dielectric of a prescribed thickness of the first dielectric between the gate electrodes in the memory region, and at the same time, forming the second dielectric on the sides of each gate electrode in the peripheral circuity region;
   (f) implanting high-concentration impurity ions of the second conductivity type into the semiconductor substrate using the gate electrodes and the second dielectrics as masks to form a highly doped source-drain of the second conductivity type of the LDD transistor in the peripheral circuit region;
   (g) coating a photoresist over the existing surface, this photoresist having an opening above each bit into which data is to be written; and
   (h) implanting impurity ions of the second conductivity type into the semiconductor substrate using the photoresist as a mask to write data in the bit;
   wherein step (c) includes a step of forming the gate electrodes so that the ratio of the height of the gate electrodes to the distance between neighboring gate electrodes equals or exceeds 1, and step (e) includes a step of depositing the second dielectric to a thickness ½ or more the distance between the neighboring gate electrodes and a step of etching back the second dielectric to leave the prescribed thickness of the second dielectric unetched on the first dielectric between the gate electrodes in the memory region and to leave the second dielectric on the sides of each gate electrode in the peripheral circuit region.

7. The method according to claim 6, wherein the prescribed thickness of the second dielectric is determined so that the projection range of the implanting ion beam used in step (h) scattered forward through the second dielectric into the source-drain region does not exceed the junction depth of the source-drain.

8. The method according to claim 6, wherein the first and second conductivity types are P and N types respectively, the length of each electrode is designed to be on the order of submicrometers, lightly doped source-drain layers and lightly doped layers of the LDD transistor in step (d) are $N^-$-type diffusion layers, and the highly doped source-drain in step (f) is of a $N^+$-type diffusion layer.

9. The method according to claim 6, wherein the prescribed thickness of the second dielectric is determined so that the projection range of the implanting ion beam used in step (h) scattered forward through the second dielectric into the source-drain region does not exceed the junction depth of the source-drain.

10. The method according to claim 6, wherein in step (h) a kind and concentration of impurity ions in the implanting ion beam are so selected as to form an $N^-$ type channel doped layer in each bit into which a data is to be written.

* * * * *